United States Patent
Song et al.

(10) Patent No.: US 8,780,951 B2
(45) Date of Patent: Jul. 15, 2014

(54) DISTRIBUTED BRAGG'S REFLECTOR OF DIGITAL-ALLOY MULTINARY COMPOUND SEMICONDUCTOR

(75) Inventors: Jin Dong Song, Seoul (KR); Won Jun Choi, Seoul (KR); Jung Il Lee, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 460 days.

(21) Appl. No.: 12/622,192

(22) Filed: Nov. 19, 2009

(65) Prior Publication Data

US 2010/0068843 A1     Mar. 18, 2010

Related U.S. Application Data

(62) Division of application No. 11/322,804, filed on Dec. 30, 2005, now abandoned.

(30) Foreign Application Priority Data

Jan. 13, 2005  (KR) .......................... 10-2005-0003089

(51) Int. Cl.
    *H01S 3/08*     (2006.01)
(52) U.S. Cl.
    USPC ............................ 372/99; 372/50.11; 438/46
(58) Field of Classification Search
    USPC .................................... 372/99, 50.11; 438/46
    See application file for complete search history.

(56) References Cited

U.S. PATENT DOCUMENTS

| | | | |
|---|---|---|---|
| 5,780,867 A | 7/1998 | Fritz et al. | |
| 6,396,865 B1 | 5/2002 | Mawst et al. | |
| 6,455,337 B1 | 9/2002 | Sverdlov | |
| 6,472,695 B1 * | 10/2002 | Hall et al. | 257/190 |
| 6,583,033 B2 | 6/2003 | Hall et al. | |
| 7,767,480 B1 * | 8/2010 | Pickrell et al. | 438/37 |
| 2002/0025590 A1 | 2/2002 | Hall et al. | |
| 2002/0176474 A1 | 11/2002 | Huang et al. | |
| 2005/0243889 A1 * | 11/2005 | Kim et al. | 372/99 |
| 2008/0043796 A1 * | 2/2008 | Jikutani et al. | 372/50.11 |

OTHER PUBLICATIONS

International Search Report No. PCT/KR2005/003596 dated Feb. 15, 2006.

* cited by examiner

*Primary Examiner* — Yuanda Zhang
(74) *Attorney, Agent, or Firm* — NSIP Law (57) ABSTRACT

There is provided a distributed Bragg's reflector (DBR) comprising a substrate and an unit distributed Bragg's reflector (DBR) layer, wherein a multi-layer is laminated on the substrate. The unit DBR layer is composed of a multi-layer laminated structure of unit digital-alloy multinary compound semiconductor layer/multinary compound semiconductor layer or unit digital-alloy multinary compound semiconductor layer/unit digital-alloy multinary compound semiconductor layer. The unit digital-alloy multinary compound semiconductor layer is composed of the multi-layer laminated structure of the first layer of multinary compound semiconductor and the second layer of a different multinary compound semiconductor on said first layer. The digital-alloy distributed Bragg's reflector of the present invention has a uniform quality on the substance area and the filter and reflector having uniformly high quality can be mass produced by using the reflector.

12 Claims, 8 Drawing Sheets

DISTRIBUTED BRAGG'S REFLECTOR OF DIGITAL-ALLOY MULTINARY COMPOUND SEMICONDUCTOR

CROSS-REFERENCE TO RELATED APPLICATION

This application is a divisional application of U.S. patent application Ser. No. 11/322,804, filed Dec. 30, 2005 now abandoned, which claims the benefit of Korean Patent Application No. 10-2005-3089, filed Jan. 13, 2005, the entireties of which are incorporated herein by reference.

FIELD OF THE INVENTION

The present invention relates to a distributed Bragg's reflector of a digital-alloy multinary compound semiconductor.

BACKGROUND OF THE INVENTION

Figure 1:
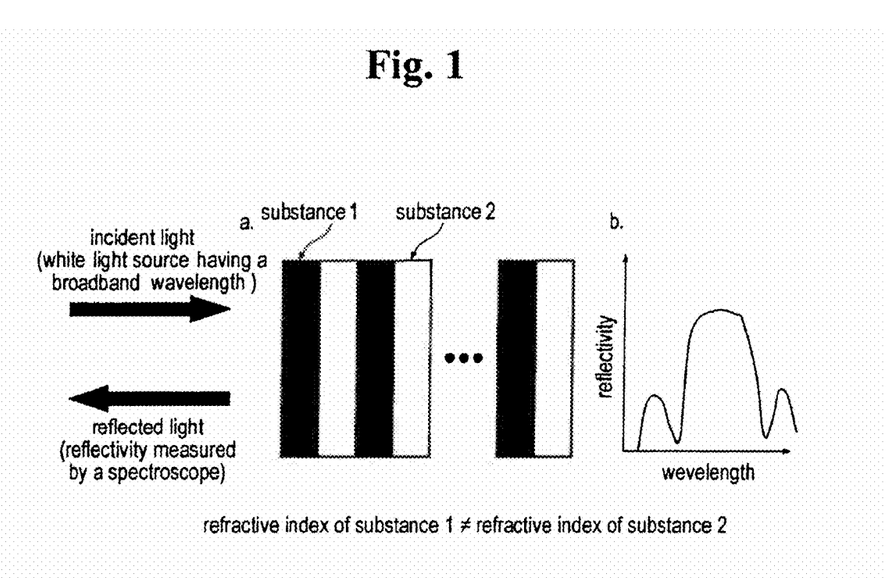
FIG. 1 shows a general structure of a distributed Bragg's reflector and a graph showing the relationship of wavelength vs. reflectivity, which is determined from the structure.

When forming materials each having a different refractive index, it is inevitable that there is a change of reflectivity within a certain wavelength range (FIG. 1). The structure formed in such a manner is referred to as a distributed Bragg's reflector (DBR).

In particular, the DBR technique can make the reflectivity to be 100% or 0% in a desired wavelength according to the refractive index difference and the thickness of each layer. Thus, the technique has been introduced to mainly fabricate filters and reflectors used in current optical devices such as camera lenses. A device, which is manufactured by applying the DBR technique to fabricate a semiconductor laser resonator, is referred to as a vertical resonator surface-emitting device (see H. Li, K. Iga, "Vertical Cavity Surface-Emitting Laser Devices," Springer, Berlin, 2002). The device emits a light in a direction perpendicular to a plane forming the semiconductor active layer. Such device has been often utilized as a light source in connection with small optical communication and optical recording apparatuses due to its low production costs, as well as its low optical spreading and optical coupling.

The key components of the vertical resonator device are DBRs, which are formed relative to the semiconductor active layer. DBRs are generally fabricated by laminating dielectric materials each having a different refractive index or by laminating compound semiconductors, which are lattice-matched to a substrate and have differing compositions.

For example, in case of a commercially available vertical resonator surface-emitting device having a mean wavelength of 0.98 μm, DBR is prepared by laminating a pair of AlGaAs/GaAs. Also, DBR can be prepared by laminating a pair of InGaAlAs/InGaAlAs in case of 1.3 to 1.55 μm broadband vertical resonator surface-emitting device, wherein the former InGaAlAs and the latter InGaAlAs have differing compositions. However, the mean reflection wavelength of DBR changes too easily, even when there is a slight change in the composition and thickness.

In a large area semiconductor, the composition of materials is subjected to DBR changes due to an unequal heating of the substrate, thereby decreasing uniformity. Furthermore, since the composition and thickness must be controlled each time DBR is fabricated, there is needed a substantial effort to maintain the conditions of apparatus for fabricating the same, which obviously decreases productivity.

SUMMARY OF THE INVENTION

Therefore, it is an object of the present invention to provide a Bragg's reflector of a digital-alloy multinary compound semiconductor, which is capable of obtaining uniformity in mass production while displaying uniformity in fabricating a large area reflector.

Thus, the present invention relates to a Bragg's reflector of a digital-alloy multinary compound semiconductor, which has such excellent properties.

More specifically, the distributed Bragg's reflector of the present invention comprises a substrate and an unit distributed Bragg's reflector (DBR) layer, as well as a multi-layer laminated on the substrate. Said unit DBR layer is composed of a multi-layer laminated structure of unit digital-alloy multinary compound semiconductor layer/multinary compound semiconductor layer or unit digital-alloy multinary compound semiconductor layer/unit digital-alloy multinary compound semiconductor layer. Said unit digital-alloy multinary compound semiconductor layer is composed of the multi-layer laminated structure of the first layer of multinary compound semiconductor and the second layer of a different multinary compound semiconductor on said first layer.

In said distributed Bragg's reflector of the present invention, the thickness of each layer constituting the unit digital-alloy multinary compound semiconductor layer may be smaller than the wavelength of the light inside the digital-alloy multinary compound semiconductor layer.

Furthermore, the multinary compound semiconductor layer constituting said unit DBR layer can be composed of a separate digital-alloy multinary compound semiconductor layer, which has a different composition from the digital-alloy multinary compound semiconductor layer that underlies the separate digital-alloy multinary compound semiconductor layer.

This and other objects and advantages of the present invention will be clarified in the following detailed description of the invention provided below.

BRIEF DESCRIPTION OF DRAWINGS

The above and other objects and features of the present invention will become apparent from the following description of the preferred examples given in conjunction with the accompanying drawings.

DETAILED DESCRIPTION OF THE PRESENT INVENTION

According to one embodiment of the present invention, a one unit DBR layer comprises a multi-layer laminated structure of AlGaAs digital-alloy multinary compound semiconductor layer/GaAs layer, wherein said AlGaAs digital-alloy multinary compound semiconductor layer comprises an AlAs layer and a GaAs layer on the AlAs layer.

Further, the unit digital-alloy multinary compound semiconductor layer of the present invention can be selected from a group consisting of InGa(Al)As/In(Ga)AlAs, InGaAsP/InGaAsP, InGaP/InAlP, Si/(Si)Ge, (In)GaAlAsSb/(In)GaAlAsSb, InGaAlAs(N)/InGaAlAs(N) and $SiO_x/TiO_x$.

Moreover, the present invention provides a vertical resonator surface light-emitting laser diode, a vertical resonance light-emitting diode (LED) and a photodetector including the distributed Bragg's reflector of the present invention.

The term "digital-alloy," as used herein, means a material prepared by multi-layer laminating each of the unit composition materials (in case of AlGaAs, AlAs and GaAs) in an uniform thickness (e.g., 1 to 2 nm thickness in fabricating multinary compound semiconductor, ternary compound semiconductor such as AlGaAs, or quaternary compound semiconductor such as InGaAlAs. The digital-alloy is used for discriminating against an ordinary multinary compound semiconductor (J. D. Song, D. C. Heo, I. K. H, J. M. Kim, Y. T. Lee, S. H. Park, "Parametric study on optical properties of digital-alloy In(Ga1-zAlz)As/InP grown by molecular-beam epitaxy," Appl. phys. lett. 84, pp. 873 (2004)).

Figure 2A:
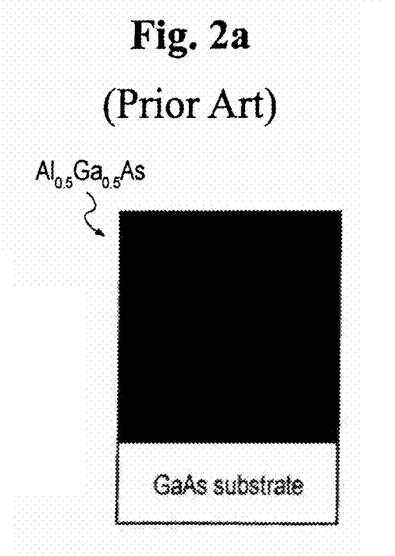
FIG. 2a shows a structure of a conventional multinary compound semiconductor.
Figure 2B:
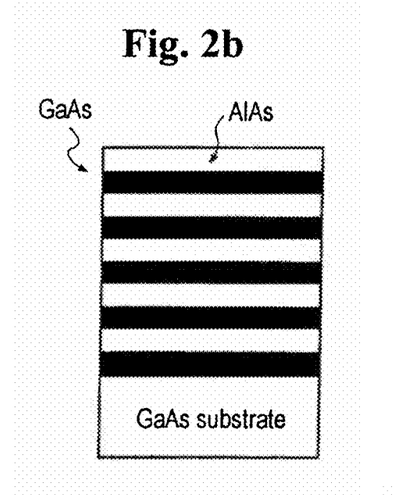
FIG. 2b shows a digital-alloy multinary compound semiconductor according to the present invention.
Figure 3:
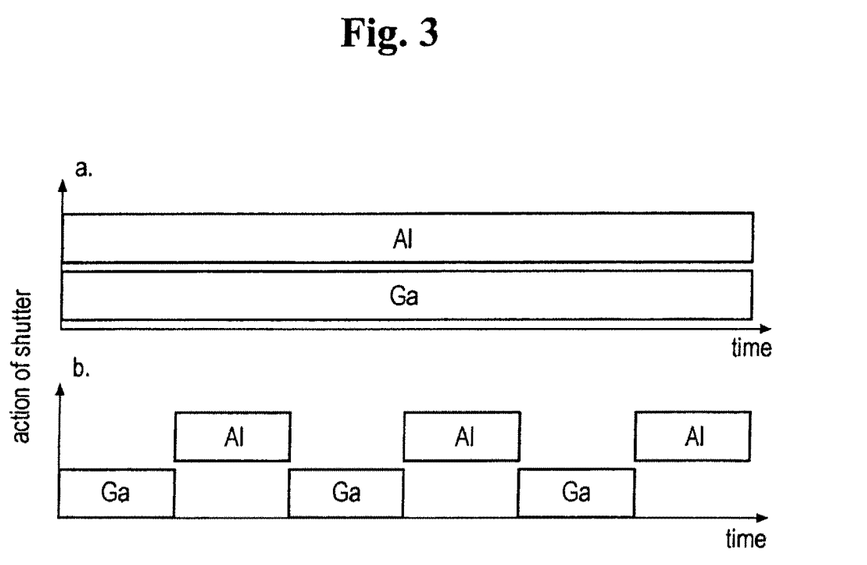
FIG. 3 shows an exemplified method of fabricating a conventional multinary compound semiconductor (a), as well as that of fabricating a digital-alloy multinary compound semiconductor according to the present invention (b).

FIG. 2a shows the structure of a conventional multinary compound semiconductor. FIG. 2b shows the structure of a digital-alloy multinary compound semiconductor $Al_{0.5}Ga_{0.5}As$ of the present invention. The composition of $Al_{0.5}Ga_{0.5}As$ digital-alloy of the present invention depends on the ratio of thickness of each unit composition material. FIG. 3 illustrates a method of fabricating the conventional multinary compound semiconductor (a), as well as that of the digital-alloy multinary compound semiconductor $Al_{0.5}Ga_{0.5}As$ according to the present invention (b). There is illustrated a specific action of a shutter for fabricating the conventional multinary compound semiconductor and the digital-alloy multinary compound semiconductor of the present invention by using the representative compound semiconductor growth method, that is, molecular beam epitaxy. From FIG. 3, it can be noted that it is possible to grow the structure of FIG. 2a by (a) of FIG. 3 as well as the structure of FIG. 2b by (b) of FIG. 3.

The features and effects of the present invention will now be described in detail while presenting as one embodiment the distributed Bragg's reflector fabricated by laminating the $Al_{0.9}Ga_{0.1}As$/GaAs-paired layer seventeen (17) times.

Figure 4:
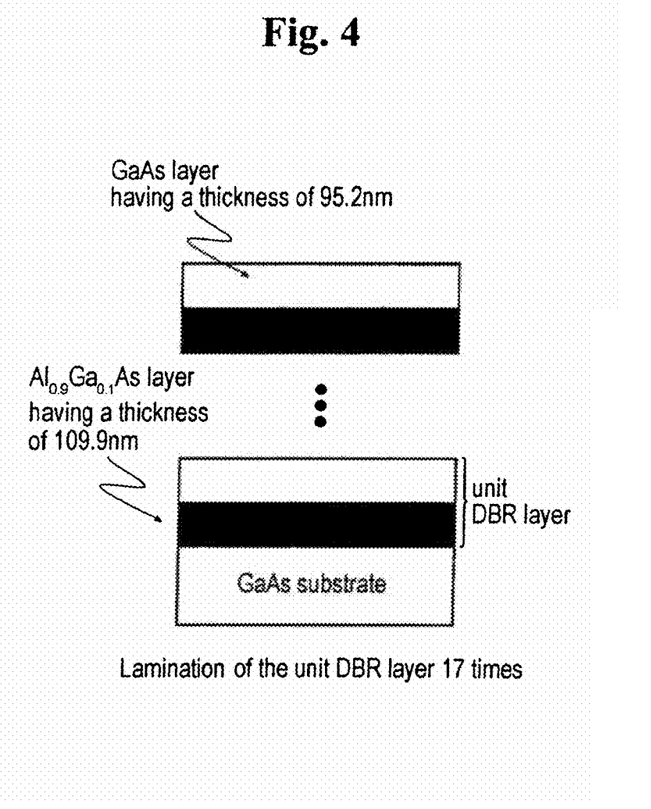
FIG. 4 shows a laminated structure of 17 $Al_{0.9}Ga_{0.1}As$/GaAs-paired layers in a conventional distributed Bragg's reflector.
Figure 5:
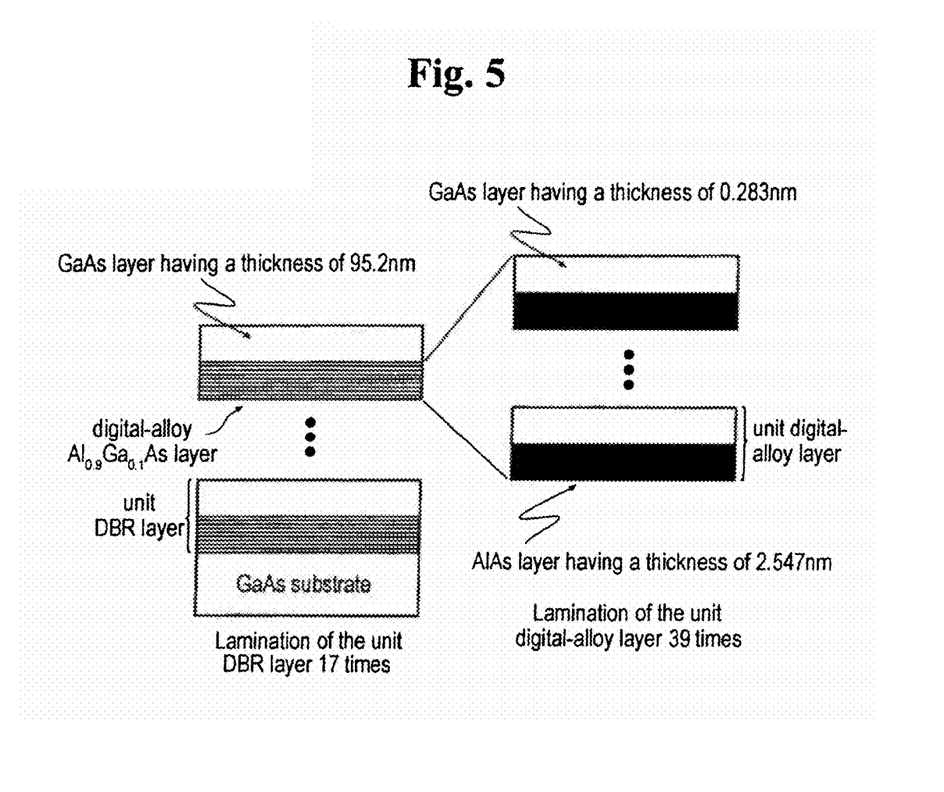
FIG. 5 shows a laminated structure of 17 digital-alloy $Al_{0.9}Ga_{0.1}As$/GaAs-paired layers in a digital-alloy distributed Bragg's reflector of the present invention.

The apparatus used for fabricating the structure of FIG. 4 and FIG. 5 is a molecular beam growth apparatus, V80 manufactured by VG Semicon (UK). The apparatus used an ion pump for performing a vacuum formation, wherein the vacuum before growth was $2.5 \times 10^{-11}$ torr and the vacuum during the growth was $2 \times 10^{-7}$ torr or less. The apparatus is equipped with two Ga sources, one Al source and one As source. The respective growth rate of AlAs and GaAs are 2 Å/s and 2.4 Å/s. In growing AlGaAs, the GaAs growth rates of two Ga sources were set at 2.4 Å/s and 0.22 Å/s, respectively, so that all structures can be grown without any growth stoppage. The pressure ratio of As/Ga was about 10:1. GaAs substrate was heated at a temperature of 600° C. to remove the oxidizing film of the substrate surface. The temperature was then decreased to 580° C. so that GaAs, which has a thickness of about 100 nm, may be grown as a buffer. Thereafter, the structures of FIG. 4 and FIG. 5 were grown at 580° C.

The conventional multinary compound semiconductor, as shown in FIG. 4, was fabricated by laminating the GaAs (thickness: 95.2 nm)/$Al_{0.9}Ga_{0.1}As$ (thickness: 109.9 nm)-paired layer on the GaAs substrate seventeen (17) times. That is, as exemplified in (a) of FIG. 3, in fabricating $Al_{0.9}Ga_{0.1}As$, the As source shutter is always opened (As supply state). The Al source shutter set to 2 Å/s of the growth rate in growing AlAs, as well as the Ga source shutter set to 0.22 Å/s of the growth rate in growing GaAs, are opened at once. At this time, the growth rate of $Al_{0.9}Ga_{0.1}As$ is 2.22 Å/s and thus, the desired $Al_{0.9}Ga_{0.1}As$ of 109.9 nm can be obtained during growth of about 495.0 seconds. In fabricating the GaAs layer having 95.2 nm thickness, another Ga source is used, wherein said source is set to the growth rate of 2.4 Å/s in growing GaAs (the growth period of about 396.6 seconds). Therefore, a total of two Ga sources are necessary for fabricating all structures without any interruption of growth. The entire structure is completely fabricated by laminating the $Al_{0.9}Ga_{0.1}As$/GaAs-paired layer seventeen (17) times.

The digital-alloy of the present invention was fabricated by multi-layer laminating on the GaAs substrate a pair of GaAs having the thickness of 95.2 nm and the digital-alloy $Al_{0.9}Ga_{0.1}As$ as shown in FIG. 5. Herein, the digital-alloy $Al_{0.9}Ga_{0.1}As$ was fabricated by laminating GaAs (thickness: 0.283 nm)/AlAs (thickness: 2.547 nm)–paired layer thirty-nine (39) times. The thickness ratio of each unit composition material (GaAs:AlAs) is 1:9, on which the composition of $Al_{0.9}Ga_{0.1}As$ digital-alloy depends. The $Al_{0.9}Ga_{0.1}As$ digital-alloy was manufactured as in shown in (b) of FIG. 3. The shutter of As source was always opened (As supply state), wherein the Al source shutter set to 2 Å/s of the growth rate in growing AlAs and the Ga source shutter set to 2.4 Å/s of the growth rate in growing GaAs were opened successively. That is, the Ga source shutter was opened for 1.2 seconds, thereby growing GaAs having the thickness of 0.283 nm. Thereafter, the Al source shutter was opened for 12.7 seconds to grow AlAs having a thickness of 2.547 nm. It does not matter whether GaAs or AlAs is grown first. Rather, it is important that the shutters of Ga and Al sources are not opened at once. That is, the shutter of Ga source and the shutter of Al source should be repetitively opened in a successive manner. When laminating such grown GaAs and AlAs thirty-nine (39) times, it results in the formation of the $Al_{0.9}Ga_{0.1}As$ digital-alloy. The GaAs layer having a thickness of 95.2 nm is made by using the Ga source, which is previously set to 2.4 Å/s of the growth rate in growing GaAs (growth period of about 396.6 seconds). Therefore, only one Ga source is required for fabricating all structures without any interruption of growth. The entire structure was fabricated by laminating the $Al_{0.9}Ga_{0.1}As$ digital-alloy/GaAs-paired layer seventeen (17) times.

Figure 6:
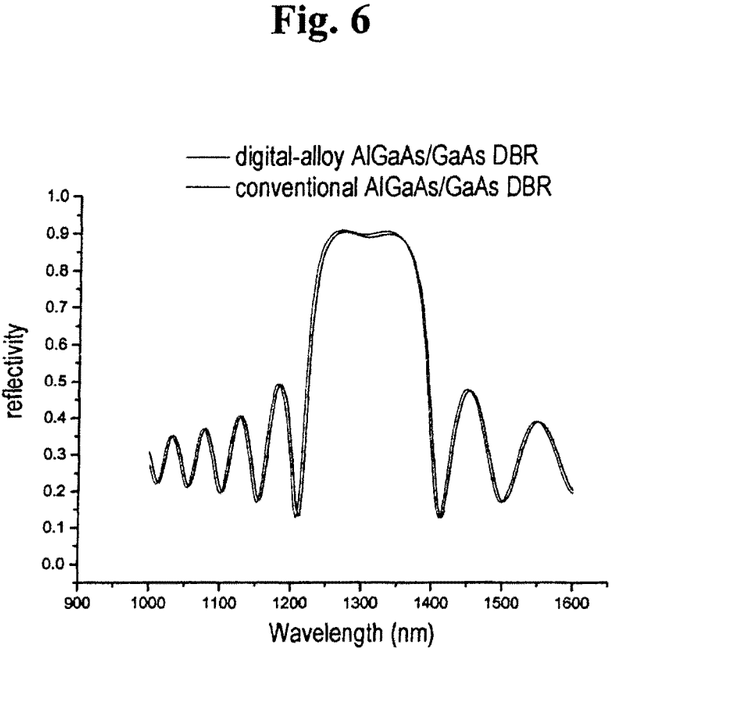
FIG. 6 is a graph showing a relationship between reflectivity and wavelength in the Bragg's reflector shown in FIGS. 4 and 5.

FIG. 6 is a graph showing the computer simulation results of reflectivity vs. wavelength in the Bragg's reflector, which is shown in FIGS. 4 and 5. From FIG. 6, it was noted that two reflectivity were substantially identical with just a slight difference. This means that the digital-alloy Bragg's reflector of the present invention showed a refractive index identical to the conventional alloy for a light having a wavelength of 1.3 μm. This also means that the influence by each interface does not occur since the thickness of the unit composition material in the digital-alloy is merely 1/150 of the wavelength of light in the semiconductor (refractive index: ≤3.5).

Figure 7:
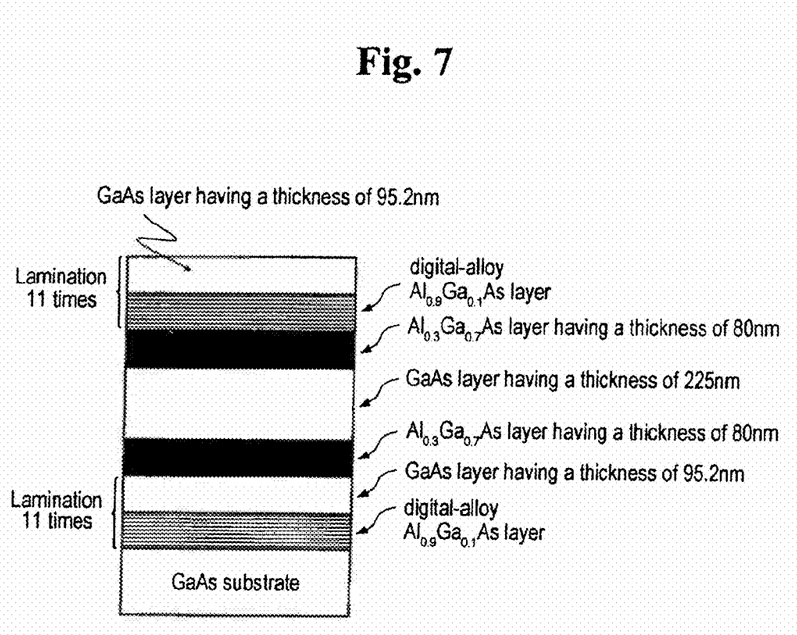
FIG. 7 shows a structure of a digital-alloy distributed Bragg's reflector vertical resonator, which utilizes a digital-alloy $Al_{0.9}Ga_{0.1}As$/GaAs structure shown in FIG. 5.
Figure 8:
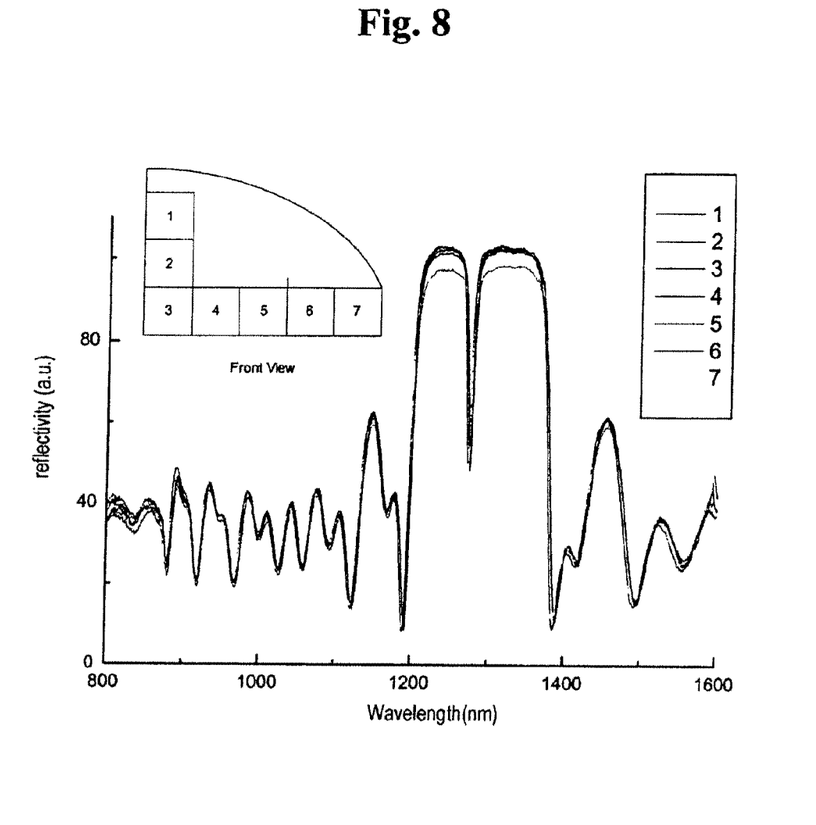
FIG. 8 is a graph showing a relationship between reflectivity, wavelength and large area (3 inches) uniformity in a digital-alloy distributed Bragg's reflector vertical resonator of the present invention.

FIG. 7 shows a structure of the digital-alloy distributed Bragg's reflector vertical resonator, which utilizes the digital-alloy $Al_{0.9}Ga_{0.1}As$/GaAs structure of the present invention shown in FIG. 5. FIG. 8 is a graph Slowing the relationship of reflectivity, wavelength and large area (3 inches) uniformity in the digital-alloy distributed Bragg's reflector vertical resonator, which utilizes the $Al_{0.9}Ga_{0.1}As$/GaAs structure of the present invention as shown in FIG. 7.

As shown in FIG. 8, the reflectivity is sharply decreased at the central position in the determined reflectivity graph. This is because Fabry-Perot passing phenomenon occurs due to two reflectors, which are present at the upper and lower positions of the device. There are many methods of determining the substrate uniformity. The present invention used a distributed level [{(determined maximum value+minimum value)−average value}/average value] as the standard of determining uniformity, which is ordinarily used in the relevant industry. In other words, as the distributed level becomes lower, it is generally considered that the substrate uniformity becomes better. The large area (3 inches) distributed level of Fabry-Perot passing wavelength is 0.35%. When considering that the average distributed level of 2 inch-substrate in the industry is 1% and the area of 3 inch-substrate is almost twice as large as the 2 inch-substrate, it can be noted that the example of the present invention shows 6 times higher uniformity than the conventional DBR.

Since each unit composition material is grown in a time interval in the digital-alloy method shown in FIG. 3, only a composite material (e.g., GaAs or AlAs) grows when grown on the substrate. That is, the composition change due to the substrate area and temperature imbalance during the growth period does not affect such growth of the composition material. Further, since the growth rate of the elemental compound can be measured in a direct method during the growth of the compound in the growth apparatus, the growth rate of each elemental compound can be accurately identified regardless of the experimental frequency. For these reasons, the digital-alloy semiconductor achieves both the area and time uniformity.

Furthermore, since all multinary compounds are manufactured by using the elemental compound, the multinary compound having various compositions can be grown homogenously on one substrate. For this reason, the structure of the growing apparatus can be simplified and it is easy to maintain and operate the apparatus, thereby improving productivity. Therefore, the digital-alloy distributed Bragg's reflector of the present invention has a uniform quality on the substance area and the filter and reflector having uniformly high quality can be mass produced by using the reflector.

The group IV semiconductors such as Si/(Si)Ge may be also be used in the semiconductor layer in some embodiments of the present invention, although Si/(Si)Ge forms a binary alloy, not a multinary alloy. Furthermore, while the present invention has been shown and described with respect to a preferred embodiment, those skilled in the art will recognize that various changes and modifications may be made without departing from the scope of the invention as defined in the appended claims.

What is claimed is:

1. A method of making a resonator, the method comprising:
   regulating a shutter action to fabricate a first multinary compound semiconductor layer, a second multinary compound semiconductor layer, and a third multinary compound semiconductor layer, using molecular beam epitaxy;
   providing an Al source shutter, set to provide a first predetermined growth rate;
   providing an As source shutter, set to provide a second predetermined growth rate; and
   providing a Ga source shutter, set to provide a third predetermined growth rate,
   wherein the ratio of thickness between the first and second multinary compound semiconductor layers determines the composition of a unit digital alloy multinary compound semiconductor layer; the thickness of the third multinary compound semiconductor layer determines the composition of a unit distributed Bragg's reflector (DBR);
   wherein the unit digital alloy multinary compound semiconductor layer is formed by combining the first and second multinary compound semiconductor layers; the unit distributed Bragg's reflector (DBR) is formed by comnining the unit digital alloy multinary compound semiconductor layer with the third multinary compound semiconductor layer; and
   wherein the As source shutter is configured to remain open while the Al and Ga source shutters are configured to alternate between open and close states, such that the Al and Ga sources are not opened at the same time.

2. The method of claim 1, wherein the second multinary compound semiconductor layer is laminated on top of the first multinary compound semiconductor layer.

3. The method of claim 1, wherein the second multinary compound semiconductor layer is composed of a different multinary compound semiconductor from the first multinary compound semiconductor layer.

4. The method of claim 1, wherein the thickness of each multinary compound semiconductor layer is smaller than a wavelength of light inside the unit digital alloy compound semiconductor layer.

5. The method of claim 1, wherein the Ga source shutter and the Al source shutter are repetitively opened and closed in a successive manner to yield the first multinary compound semiconductor layer that is a GaAs layer and the second multinary compound semiconductor layer that is an AlAs layer.

6. The method of claim 5, wherein the ratio of the thickness of the second multinary compound semiconductor layer to the thickness of the first muitinary compound semiconductor layer greater than 5 to 1.

7. The method of claim 6, further comprising successively laminating at least two grown GaAs and AlAs pairs to form the digital alloy multinary compound semiconductor layer that has a composition of $Al_{0.9}Ga_{0.1}As$.

8. The method of claim 7, further comprising laminating the digital alloy multinary compound semiconductor layer with the third multinary compound semiconductor layer.

9. The method of claim 8, wherein the third multinary compound semiconductor layer is a GaAs layer so that an $Al_{0.9}Ga_{0.1}As$/GaAs paired layer is formed.

10. The method of claim 9, wherein the $Al_{0.9}Ga_{0.1}As$/GaAs paired layer is laminated 15-20 times.

11. The method of claim 1, further comprising adding one multinary compound semiconductor substrate to the unit DBR to form a DBR laminate structure.

12. The method of claim 1, wherein the unit digital alloy comprises one of InGa(Al)As/In(Ga)AlAs, InGaAsP/InGaAsP, InGaP/InAlP, Si/(Si)Ge, (In)GaAlAsSb/(In)GaAlAsSb, InGaAlAs(N)/InGaAlAs(N) and $SiO_x$/$TiO_x$.

* * * * *